(12) United States Patent
Weber et al.

(10) Patent No.: US 7,828,983 B2
(45) Date of Patent: Nov. 9, 2010

(54) SEMICONDUCTOR TEXTURING PROCESS

(75) Inventors: Klaus Johannes Weber, Australian Capitol Territory (AU); Andrew William Blakers, Australian Capitol Territory (AU)

(73) Assignee: Transform Solar Pty Ltd, Sydney NSW (AU)

( * ) Notice: Subject to any disclaimer, the term of this patent is extended or adjusted under 35 U.S.C. 154(b) by 87 days.

(21) Appl. No.: 10/497,248

(22) PCT Filed: Nov. 29, 2002

(86) PCT No.: PCT/AU02/01625

§ 371 (c)(1),
(2), (4) Date: Nov. 8, 2004

(87) PCT Pub. No.: WO03/047004

PCT Pub. Date: Jun. 5, 2003

(65) Prior Publication Data

US 2005/0104163 A1    May 19, 2005

(30) Foreign Application Priority Data

Nov. 29, 2001    (WO) .................... PCT/AU01/01546

(51) Int. Cl.
*B44C 1/22* (2006.01)
*H01L 21/00* (2006.01)

(52) U.S. Cl. .............. 216/17; 216/67; 216/79; 216/83; 438/710; 438/719; 438/745; 438/753

(58) Field of Classification Search .......... 216/67, 216/79, 58, 83; 438/710, 719, 745, 753, 438/706

See application file for complete search history.

(56) References Cited

U.S. PATENT DOCUMENTS 3,278,811 A    10/1966  Mori et al. ............ 136/244
3,422,527 A    1/1969   Gault ................... 29/572

(Continued)

FOREIGN PATENT DOCUMENTS

DE    3803769    8/1989

(Continued)

OTHER PUBLICATIONS

Chien, F. S-S. et al., "Nanometer-scale conversion of Si3N4 to SiOx," Applied Physics Letters, Jan. 17, 2000, AIP, American Institute of Physics, Melville, NY, US, 76(3), 360-362.

(Continued)

*Primary Examiner*—Shamim Ahmed
(74) *Attorney, Agent, or Firm*—Woodcock Washburn LLP (57) ABSTRACT

The invention provides a process for texturing a surface of a semiconductor material, the process comprising: applying a layer of a protective substance on said surface wherein said layer is sufficiently thin that it has a plurality of apertures therethrough; and contacting said layer and said semiconductor material with an etchant capable of etching said semiconductor material faster than said protective substance, said etchant making contact with said semiconductor material at least through said apertures, for a time and under conditions in which said semiconductor material is etched by said etchant in the vicinity of said apertures to produce a textured surface on said semiconductor material, but said protective substance is substantially unetched.

51 Claims, 6 Drawing Sheets

U.S. PATENT DOCUMENTS

| | | | |
|---|---|---|---|
| 3,647,581 A | 3/1972 | Mash | 148/175 |
| 3,690,953 A | 9/1972 | Wise | 136/89 |
| 3,985,579 A | 10/1976 | Rahilly | 136/89 |
| 4,038,104 A | 7/1977 | Tsutomu | 136/89 P |
| 4,082,570 A | 4/1978 | House et al. | 136/89 SJ |
| 4,110,122 A | 8/1978 | Kaplow et al. | 136/89 P |
| 4,153,476 A | 5/1979 | Frosh et al. | 136/246 |
| 4,278,473 A | 7/1981 | Borden | 136/249 |
| 4,332,973 A | 6/1982 | Sater | 136/246 |
| 4,406,913 A | 9/1983 | Weyrich | |
| 4,409,422 A | 10/1983 | Sater | 136/244 |
| 4,409,423 A | 10/1983 | Holt et al. | 136/255 |
| 4,444,992 A | 4/1984 | Cox, III et al. | 136/248 |
| 4,516,314 A | 5/1985 | Sater | 29/572 |
| 4,527,183 A | 7/1985 | Anthony et al. | 357/30 |
| 4,554,727 A | 11/1985 | Deckman | |
| 4,626,613 A | 12/1986 | Wenham et al. | 136/255 |
| 4,633,031 A | 12/1986 | Todorof et al. | 136/249 |
| 4,686,321 A | 8/1987 | Kishi | |
| 4,692,782 A | 9/1987 | Seki et al. | 257/53 |
| 4,805,006 A | 2/1989 | Yamaguchi et al. | |
| 4,883,561 A | 11/1989 | Gmitter et al. | 156/633 |
| 4,892,592 A | 1/1990 | Dickson et al. | 136/244 |
| 4,982,099 A | 1/1991 | Lischke | 250/492.2 |
| 4,989,059 A | 1/1991 | Micheels et al. | 357/30 |
| 5,011,544 A | 4/1991 | Gaddy et al. | |
| 5,016,073 A | 5/1991 | Elliott et al. | |
| 5,067,985 A | 11/1991 | Carver et al. | 136/255 |
| 5,073,230 A | 12/1991 | Maracas et al. | 156/631 |
| 5,081,049 A | 1/1992 | Green et al. | 437/2 |
| 5,082,791 A | 1/1992 | Micheels et al. | 437/2 |
| 5,098,482 A | 3/1992 | Warfield | |
| 5,116,464 A | 5/1992 | Edell et al. | 438/753 |
| 5,136,346 A | 8/1992 | Kornowski | |
| 5,139,974 A | 8/1992 | Sandhu et al. | 437/228 |
| 5,149,676 A | 9/1992 | Kim et al. | |
| 5,266,125 A | 11/1993 | Rand et al. | 136/244 |
| 5,279,703 A | 1/1994 | Haberger et al. | 56/635 |
| 5,306,647 A | 4/1994 | Lehmann et al. | 437/2 |
| 5,324,679 A | 6/1994 | Kim et al. | |
| 5,330,584 A | 7/1994 | Saga et al. | |
| 5,344,517 A | 9/1994 | Houlding | 156/236 |
| 5,352,530 A | 10/1994 | Tanuma et al. | |
| 5,367,217 A | 11/1994 | Norling | |
| 5,389,158 A | 2/1995 | Fraas et al. | |
| 5,391,236 A | 2/1995 | Krut et al. | 136/249 |
| 5,447,576 A | 9/1995 | Willis | |
| 5,461,002 A | 10/1995 | Safir | |
| 5,466,302 A | 11/1995 | Carey et al. | |
| 5,470,761 A | 11/1995 | McKee et al. | |
| 5,474,620 A | 12/1995 | Nath et al. | |
| 5,478,402 A | 12/1995 | Hanoka | |
| 5,494,832 A | 2/1996 | Lehmann et al. | 437/2 |
| 5,538,563 A | 7/1996 | Finkl | 136/246 |
| 5,538,902 A | 7/1996 | Izu et al. | |
| 5,567,248 A | 10/1996 | Chung | |
| 5,567,656 A | 10/1996 | Chun | |
| 5,609,694 A | 3/1997 | Asai | |
| 5,641,381 A | 6/1997 | Bailey et al. | 438/455 |
| 5,733,382 A | 3/1998 | Hanoka | |
| 5,773,791 A | 6/1998 | Kuykendal | 219/121.84 |
| 5,851,928 A * | 12/1998 | Cripe et al. | 438/748 |
| 5,852,322 A | 12/1998 | Speckbacher | |
| 5,895,530 A | 4/1999 | Shrotriya et al. | |
| 5,902,120 A | 5/1999 | Igel et al. | |
| 5,904,546 A | 5/1999 | Wood et al. | |
| 5,904,548 A | 5/1999 | Orcutt et al. | 438/462 |
| 5,930,644 A * | 7/1999 | Tsai et al. | 438/424 |
| 5,972,732 A | 10/1999 | Gee et al. | |
| 5,985,742 A | 11/1999 | Henley et al. | 438/515 |
| 5,994,641 A | 11/1999 | Kardauskas | |
| 5,997,713 A * | 12/1999 | Beetz et al. | 205/124 |
| 6,005,276 A | 12/1999 | Forrest et al. | |
| 6,008,449 A | 12/1999 | Cole | 136/246 |
| 6,066,516 A | 5/2000 | Miyasaka et al. | 438/149 |
| 6,074,514 A * | 6/2000 | Bjorkman et al. | 156/345.35 |
| 6,091,021 A | 7/2000 | Ruby et al. | |
| 6,107,161 A | 8/2000 | Kitaguro et al. | |
| 6,110,793 A | 8/2000 | Lee et al. | |
| 6,126,311 A | 10/2000 | Schuh | |
| 6,127,623 A * | 10/2000 | Nakamura et al. | 136/256 |
| 6,127,714 A | 10/2000 | Mochizuki | |
| 6,130,380 A | 10/2000 | Nakamura | |
| 6,140,603 A | 10/2000 | Hwang et al. | 219/121.69 |
| 6,143,976 A | 11/2000 | Endrōs | 136/256 |
| 6,156,620 A * | 12/2000 | Puchner et al. | 438/400 |
| 6,156,967 A | 12/2000 | Ralph et al. | |
| 6,156,968 A | 12/2000 | Nishimoto et al. | |
| 6,162,658 A | 12/2000 | Green et al. | |
| 6,166,318 A | 12/2000 | Freeouf | 136/249 |
| 6,168,968 B1 | 1/2001 | Umemoto et al. | 438/96 |
| 6,172,297 B1 | 1/2001 | Hezel et al. | 136/256 |
| 6,180,869 B1 | 1/2001 | Meier et al. | |
| 6,184,457 B1 | 2/2001 | Tsuzuki et al. | |
| 6,262,358 B1 | 7/2001 | Kamimura et al. | |
| 6,265,653 B1 | 7/2001 | Haigh et al. | |
| 6,265,741 B1 * | 7/2001 | Schrems | 257/301 |
| 6,294,723 B2 | 9/2001 | Uematsu et al. | 136/246 |
| 6,316,281 B1 * | 11/2001 | Lee et al. | 438/31 |
| 6,320,115 B1 | 11/2001 | Kataoka et al. | |
| 6,320,116 B1 | 11/2001 | Hanoka | |
| 6,323,415 B1 | 11/2001 | Uematsu et al. | |
| 6,406,979 B2 | 6/2002 | Fischer et al. | |
| 6,407,327 B1 | 6/2002 | Ralph et al. | |
| 6,407,329 B1 | 6/2002 | Lino et al. | |
| 6,410,843 B1 | 6/2002 | Kishi et al. | |
| 6,455,873 B1 | 9/2002 | Lonergan | |
| 6,479,744 B1 | 11/2002 | Tsuzuki et al. | |
| 6,492,704 B1 | 12/2002 | Coroy | |
| 6,515,217 B1 | 2/2003 | Aylaian | |
| 6,515,218 B1 | 2/2003 | Shimizu et al. | |
| 6,525,374 B1 | 2/2003 | Sittig et al. | |
| 6,553,729 B1 | 4/2003 | Nath et al. | |
| 6,583,032 B1 | 6/2003 | Ishikawa et al. | |
| 6,846,984 B2 | 1/2005 | Fath et al. | 136/256 |
| 2001/0013630 A1 | 8/2001 | Cho et al. | 257/419 |
| 2002/0119290 A1 | 8/2002 | Park et al. | |
| 2004/0097012 A1 | 5/2004 | Weber et al. | |
| 2004/0119067 A1* | 6/2004 | Weeks et al. | 257/40 |
| 2005/0272225 A1 | 12/2005 | Weber et al. | |

FOREIGN PATENT DOCUMENTS

| | | |
|---|---|---|
| DE | 19650111 | 6/1998 |
| DE | 19907506 A1 | 9/1999 |
| EP | 0 083 510 A2 | 7/1983 |
| EP | 0 718 873 A2 | 6/1996 |
| EP | 0 991 129 A1 | 4/2000 |
| EP | 1 182 710 A1 | 2/2002 |
| GB | 1 383 165 | 2/1975 |
| JP | S53-073075 | 6/1978 |
| JP | 58010873 | 1/1983 |
| JP | 59059883 * | 4/1984 |
| JP | S59-123279 | 7/1984 |
| JP | S59-123283 | 7/1984 |
| JP | S61-108176 | 5/1986 |
| JP | S62-054927 | 3/1987 |
| JP | 63295500 | 12/1988 |
| JP | 3-6824 | 1/1991 |
| JP | 3-276682 | 12/1991 |
| JP | 6-55733 | 3/1994 |
| JP | H06-213554 | 8/1994 |
| JP | 07188947 A * | 7/1995 |
| JP | 7-302890 | 11/1995 |

| | | |
|---|---|---|
| JP | 8274371 | 10/1996 |
| JP | 09-219531 | 8/1997 |
| JP | 10193338 | 7/1998 |
| JP | 11074234 | 3/1999 |
| JP | AH11-068131 | 3/1999 |
| JP | 11090923 | 4/1999 |
| JP | 11163284 * | 6/1999 |
| JP | H11-236689 | 8/1999 |
| JP | 11-312815 | 11/1999 |
| JP | 11-312816 | 11/1999 |
| JP | 2000-36609 | 2/2000 |
| JP | 2000-101111 | 4/2000 |
| JP | 2000-261008 | 9/2000 |
| JP | A2000-277763 | 10/2000 |
| JP | A2001-257371 | 9/2001 |
| JP | 2001-332529 | 11/2001 |
| JP | 2002-217439 | 8/2002 |
| WO | 98/09318 A1 | 3/1998 |
| WO | 98/24119 A1 | 6/1998 |
| WO | 98/25312 A1 | 6/1998 |
| WO | 98/32164 A1 | 7/1998 |
| WO | WO 00/28602 | 5/2000 |
| WO | 00/62348 A1 | 10/2000 |
| WO | 00/73090 A1 | 12/2000 |
| WO | WO 02/45143 | 6/2002 |
| WO | WO 03/047004 | 6/2003 |

OTHER PUBLICATIONS

Derwent Abstract Accession No. 89-019632/03, JP 63-295500 A (Shinetsu Chemical Industries KK), Dec. 1, 1988, 1 page.

Derwent Abstract Accession No. 97-005065/01, JP 8-274371 A (Toyoda Gosei KK), Oct. 18, 1996, 3 pages.

Derwent Abstract Accession No. 98-461330/40, JP 10-193338 A (Sumitomo Metal Mining Co.), Jul. 28, 1998, 2 pages.

Derwent Abstract Accession No. 99-250716/21, JP 11-074234 A (Super Silicon Kenyusho KK), Mar. 16, 1999, 2 pages.

Derwent Abstract Accession No. 99-282246/24, JP 11-090923 A (Hitachi Cable Ltd), Apr. 6, 1999, 2 pages.

Laurell, T. et al., "Improvements of silicon integrated GOx micro enzyme reactors by the use of porous silicon as a surface enlarging matrix," $18^{th}$ Annual International Conference of the IEEE Engineering in Medicine and Biology Society, Oct. 31, 1996, 1.6.2: Microfabrication II, pp. 262-263.

Lehmann, V., " The Physics of Macropore Formation in Low Doped n-Type Silicon," J. Electrochem. Soc., 1993, 140(10), 2836-2843.

Patent Abstracts of JP, vol. 007, No. 084 (E-169), Apr. 7, 1983 and JP 58 010873 A (Nippon Denki KK), Jan. 21, 1983.

Thorp, D. et al., "Ray-tracing of arbitrary surface textures for light-trapping in thin silicon solar cells," Solar Energy Materials and Solar Cells, Nov. 1997, Elsevier Science Publishers, Amsterdam NL, 48(1-4), 295-301.

Tuttle, J.R. et al., "Progress Towards Commercialization of a 4.5-Sun, Flat-Plate Concentrating PV Module and System," IEEE, 2000, 1468-1471.

Uematsu, T. et al., "Design and Characterization of Flat-Plate Static-Concentrator Photovoltaic Modules," Solar Energy Materials & Solar Cells, 2001, 67, 441-448.

Uematsu, T. et al., "Fabrication and Characterization of a Flat-Plate Static-Concentrator Photovoltaic Module," Solar Energy Materials & Solar Cells, 2001, 67, 425-434.

Uematsu, T. et al., "Static Concentrator Photovoltaic Module with Prism Array," Solar Energy Materials & Solar Cells, 2001, 67, 415-423.

Ho, F. et al., "Recent Developments in Thin Silicon Solar Cells," NASA; Lewis Research Center space Photovoltaic Res. and Technol.; High Efficiency, Radiation Damage and Blanket Technol., 1982, 17-24 (SEE N83-15806 06-44).

Iles, P.A. et al., "Silicon Solar Cells Formed by Orientation -Dependent Slicing," IEEE; Proceedings of the $15^{th}$ Photoboltaic Specialist Conference, 1981, 115-119.

Soclof, S.I. et al., "Wafering Insight Provided by the Ode Method," JPL Proc. Of the Low-Cost Solar Array Wafering Workshop, 1982, 259-266 (SEE N82-23650 14-44).

Soclof, S.I. et al., "Improved Slicing Method for Silicon," Subcontract No. XS-0-9010-1 ( Under Prime Contract No. EG-77-C-01-4042); OSTI Identifier—OSTI ID: 5985419; DE82003517; Report Nos. SERI/TR-9010-1-T1; DOE Contract No. AC02-77CH00178, 1981, 47 pages.

Xiao, H., "Introduction to Semiconductor Manufacturing Technology," Prentice Hall Inc., 2001, pp. 129-133.

Einhaus et al., "Isotropic Texturing of Multicrystalline Silicon Wafers with Acidic Texturing Solutions," IEEE, 1997, pp. 167-170.

Search Report for Patent Application No. 091135225, Filing Date Nov. 29, 2002, 2 pages.

Blakers et al., Sliver Cells—A Complete Photovoltaic Solution, Australian National University, downloaded 2008, 4 pages.

Blakers et al., "Sliver® Modules—A Crystalline Silicon Technology of the Future," Australian National University, downloaded 2008, 4 pages.

Stocks, M.J. et al., "Texturing of Polycrystalline Silicon," Solar Energy Materials and Solar Cells, 1996, 40, 33-42.

National Phase Application No. EP 02 77 9038: Supplementary European Search Report dated Apr. 29, 2010, 2 pages.

* cited by examiner

SEMICONDUCTOR TEXTURING PROCESS

FIELD OF THE INVENTION

The present invention relates to processes for texturing the surface of a semiconductor, and to semiconductor materials having a textured surface so as to decrease their reflectivity and/or increase the capability of the semiconductor to trap light.

BACKGROUND

In order to maximize the efficiency of silicon solar cells, detectors or photodiodes, it is important to maximize the amount of light with a wavelength less than 1100 nm absorbed in the silicon. There are two mechanisms which can reduce the amount of light absorbed. Light may be reflected off the silicon surface, or it may enter the silicon and exit the silicon again some time later without having been absorbed. Both these loss mechanisms can be reduced by roughening, or texturing, the silicon surface. This reduces reflection losses by increasing the probability that a light ray will strike the silicon surface multiple times, and it reduces absorption losses by confining the light within the silicon (called light trapping).

A texturing technique which can be used for single crystal silicon of (100) orientation is to etch the silicon in a solution of potassium hydroxide (KOH) and isopropyl alcohol (IPA). This results in a surface covered in square base pyramids. However, this approach cannot be used for the case where the silicon surface is not (100) crystallographic orientation. Several other texturing techniques are currently under development which do not rely on a particular crystallographic orientation, such as the use of reactive ion etching (RIE). However, these techniques may prove to be expensive or to lead to other disadvantages, such as increased carrier recombination at the silicon surface. Further, these techniques are only suitable for the texturing of flat wafers and cannot be applied, for example, to the texturing of unexposed surfaces of silicon strips which are held in a wafer frame, such as strips produced as disclosed in International Patent Application no. WO 02/45143, the disclosure of which is incorporated herein by reference in its entirety.

Accordingly, there is a need for an improved process for decreasing the reflectivity of a surface of a semiconductor.

It is an object of the present invention to provide such a process.

SUMMARY OF THE INVENTION

In accordance with a first embodiment of the present invention, there is provided a process for texturing a surface of a semiconductor material, the process comprising:
   applying a layer of a protective substance on said surface wherein said layer is sufficiently thin that it has a plurality of apertures therethrough; and
   contacting said layer and said semiconductor material with an etchant capable of etching said semiconductor material faster than said protective substance, said etchant making contact with said semiconductor material at least through said apertures, for a time and under conditions in which said semiconductor material is etched by said etchant in the vicinity of said apertures to produce a textured surface on said semiconductor material, but said protective substance is substantially unetched.

The step of applying the layer of protective substance may be a single step, or it may involve first creating a layer of protective substance that has relatively few or no apertures in it, and then partially thinning the layer of protective substance over its entire surface until it is sufficiently thin that a plurality of apertures are formed in it. The layer of protective substance, as first created, is not perfectly smooth and is therefore thinner in some places than in others. As a result, when the surface of the layer is contacted by an etchant that etches the protective substance, or is otherwise thinned, some parts of the layer will be thinned through more quickly than other parts, giving rise to a plurality of apertures in the layer.

Accordingly, in a second embodiment of the present invention, there is provided a process for texturing a surface of a semiconductor material, the process comprising:
   creating a layer of a protective substance on said surface;
   substantially uniformly thinning said layer of protective substance until at least some apertures are formed through said layer; and
   contacting said layer and said semiconductor material with an etchant capable of etching said semiconductor material faster than said protective substance, said etchant making contact with said semiconductor material at least through said apertures, for a time and under conditions in which said semiconductor material is etched by said etchant in the vicinity of said apertures to produce a textured surface on said semiconductor material, but said protective substance is substantially unetched.

According to a third embodiment of the present invention there is provided a semiconductor material, at least part of at least one surface of which has a plurality of pits therein wherein said pits are substantially randomly arranged over said part of said at least one surface, and have an interior surface which is at least partially rounded.

According to a fourth embodiment of the present invention there is provided a semiconductor material, at least part of at least one surface of which has a plurality of pits therein wherein said pits are substantially randomly arranged over said part of said at least one surface, and have a width of up to 10 μm.

According to a fifth embodiment, the invention provides a semiconductor, at least part of a surface of which has been textured by a process of the first or second embodiment.

According to a sixth embodiment, the invention provides a semiconductor having a surface, at least part of which has been textured by etching said surface through a plurality of apertures in a layer of protective substance on said surface, said layer of protective substance having said apertures by virtue of the thinness of said layer.

The invention further provides a semiconductor material having a layer of protective substance applied to at least part of at least one surface thereof, wherein said layer of protective substance has a plurality of apertures therethrough by virtue of the thinness of said layer.

Semiconductor materials that have been textured by the process of the present invention are useful in the manufacture of solar cells. Accordingly, in a seventh embodiment the invention provides a solar cell comprising the semiconductor material of any of the third to sixth embodiments.

DETAILED DESCRIPTION OF THE PREFERRED EMBODIMENT AND OTHER EMBODIMENTS

In the processes of the present invention, by "substantially unetched" is meant that the etching is carried out under conditions in which the semiconductor material is etched in the vicinity of apertures in the protective substance, but sufficient of the protective substance remains on the surface of the semiconductor material at the end of the etching to prevent the semiconductor material from being etched in regions other than in the vicinity of the apertures.

By "substantially uniformly" is meant that the thinning is carried out under conditions in which the protective layer is thinned at substantially the same rate over its entire surface so that, in a given time, substantially the same thickness of protective substance is removed at all points over the surface.

In the processes of the invention, the protective substance is any substance that is resistant to etching by at least one etchant capable of etching the semiconductor material, or at least is etched by at least one etchant sufficiently more slowly than the semiconductor material is etched by that etchant so as to be substantially unetched under conditions employed in the processes of the invention.

In the process of the first embodiment, the layer of protective substance is typically only a few atomic layers thick and may be formed by known techniques such as chemical vapour deposition or low pressure chemical vapour deposition. Other possible techniques for applying the protective substance include spray pyrolysis, evaporation, sputtering, thermal oxidation and thermal nitridation. As a further alternative, the layer of protective substance may be a layer of polymer, and is applied to the surface of the semiconductor as a layer that is sufficiently thin that it has a plurality of holes through it. In this form of the first embodiment, the etching step is suitably carried out by plasma etching. Suitably, the polymer is applied by spin coating. Examples of suitable polymers is include polymeric photoresists used in integrated circuit manufacture. Examples of suitable plasmas for etching silicon include $SF_6$, $CF_4$ and mixtures of $CF_4$ and oxygen.

In one form of the process of the first embodiment of the invention, the layer of protective substance is applied by low pressure chemical vapour deposition, is typically about 2 nm thick, and is an incomplete layer in that it contains numerous holes though which the semiconductor material beneath the protective layer can be etched.

In the process of the second embodiment, the layer of protective substance may be deposited on the semiconductor material by any of the ways referred to above in reference to the process of the first embodiment. In the process of the second embodiment, the layer of protective substance, as deposited, is typically thicker than in the process of the first embodiment so that, when the layer is applied to the semiconductor, it has no apertures passing through it. However, a layer of protective substance applied to a surface is never of perfectly uniform thickness and when such a layer is gradually thinned, eventually a plurality of apertures is formed in the layer at the positions where it was thinnest prior to the etching. That is, as the layer is thinned, the thickness of the layer is decreased by substantially the same amount over its entire extent, until at least some portions of the layer are thinned through, so creating a plurality of apertures through the layer of protective substance.

In the process of the second embodiment, the step of thinning the layer of protective substance is typically an etching step. The etchant may be any etchant capable of etching the protective substance uniformly. Such etchants are known to persons of ordinary skill in the art and include various acids and acid mixtures, and plasmas. When the protective substance is a polymer, it is preferably thinned by plasma etching, typically using an oxygen plasma.

Typically, the apertures in the layer of protective substance are substantially randomly arranged over the surface of the protective substance, since they arise from substantially random variations in the thickness of the layer of protective substance. After the process of the first or second embodiment is carried out, therefore, etch pits remain in the semiconductor material that are substantially randomly arranged over the surface of the semiconductor material. The interior surface of the etch pits, which have the appearance of hollows formed in the surface of the semiconductor material, is usually, but not necessarily, at least partially rounded. That is, although there may be some faceting on the interior surface of the etch pits, at least part of the interior surface is usually not faceted and flat but has at least some concave regions as a result of the action of the etchant on the semiconductor material. More typically, at least half of the interior surface of the etch pits is rounded. Preferably, there is substantially no faceting on the interior surface of the etch pits. The etch pits are typically substantially circular when viewed from above the surface, except where they intersect. In some circumstances, however, the etch pits may not appear substantially circular when viewed from above, depending on the crystal orientation of the semiconductor material. Whatever their shape, the etch pits typically range in size up to about 10 μm across. More usually, the etch pits range in size from less than 1 μm to about 5 μm across. The etch pits are separated by walls that are typically thinner than the widths of the pits. Usually, at least some of the walls are substantially unetched. However, the majority of the walls are usually formed between etch pits that overlap and therefore come to a point at their top.

The etchant in the processes of the first and second embodiments may be any etchant that is capable of etching the semiconductor material faster than the protective substance. Such etchants are known to persons of ordinary skill in the art. Where an etchant is used to thin the layer of protective substance in the process of the second embodiment, it may be the same as or different to the etchant used to etch the semiconductor. When the layer of protective substance is a polymer layer, a plasma is usually used to etch the semiconductor.

The processes of the present invention result in a decreased reflectivity of a surface of a semiconductor material, compared to a polished surface, and/or they improve the light confinement (light trapping) within the semiconductor material.

In the processes of the invention, the point where an optimal degree of texturing of the semiconductor surface has been reached and etching should be terminated can be determined in several ways. One way is to monitor the appearance of a surface that is being textured, such as by eye or by using an apparatus which measures the reflectance of light from the surface. A second way is to determine, for a given set of conditions (that is, the nature of the protecting substance, its thickness, the etchant composition and the temperature) the amount of time for optimal results. This can be done by etching samples for various lengths of time and then measuring the reflectance and/or light trapping behaviour of the etched samples under appropriate conditions. The results of such measurements then allow determination of the optimal etch time. It will be appreciated, however, that if an etch solution is used to texture many wafers or many batches of wafers, the etch properties of the solution will change over time. The etch time will then need to be adjusted to continue to obtain optimal texturing results.

In the processes of the present invention, the step of contacting the semiconductor material with the etchant may result in the protective substance being etched to some extent, depending on the etchant used and the etching conditions. If the protective substance is etched to some extent during this step, this may result in more apertures being created in the protective substance, compared to the number of apertures present in the protective substance at the commencement of this step.

Immediately before the start of the step of contacting the semiconductor material with the etchant, the apertures in the layer of protective substance are very small, typically less than 100 nm in diameter, more typically less than 10 nm in diameter. As the etching step proceeds, the apertures tend to become enlarged and their number tends to increase. At the end of this etching step, the number of apertures, and therefore the number of etch pits in the semiconductor surface, typically ranges from about 10 per 100 square microns to about 1000 per 100 square microns.

Typically, in the processes of the first and second embodiments and in the semiconductor material of the third, fourth, fifth and sixth embodiments, the semiconductor material is silicon. When the semiconductor material is silicon, in the processes of the invention the protective substance is typically silicon nitride and the etchant is typically a mixture of hydrofluoric acid and nitric acid, such as a 1:50 by volume mixture of 49% by weight aqueous HF (that is, 49 g of HF in 100 g of aqueous solution) and 70% by weight aqueous nitric acid. Other chemicals may be added to the etchant solution to give desired etch properties, such as to improve wetting of the semiconductor surface. Such additives are well known to persons of ordinary skill in the art of semiconductor etching. When the semiconductor material is silicon, it may be single crystal silicon, microcrystalline silicon, multicrystalline silicon or polycrystalline silicon. A further possibility as an etchant for silicon nitride is a plasma of $CF_4$ and oxygen.

The processes of the present invention typically include the further step of removing the protective substance from the surface after the step of etching the semiconductor material has proceeded sufficiently to produce a plurality of etch pits on the surface. The protective substance may be removed by applying an etchant that etches the protective substance much more rapidly than the semiconductor material. For example, when the semiconductor material is silicon and the protective substance is silicon nitride, the protective substance may be removed by reactive ion etching or by contact with phosphoric acid at elevated temperature, typically about 180° C. Alternatively, and more preferably, silicon nitride may be removed from a silicon substrate by etching in an aqueous solution of hydrogen fluoride, typically a 5% by weight solution of hydrogen fluoride in water.

Even more typically, the processes of the present invention include the additional steps of removing the layer of protective substance after the step of etching the semiconductor material has proceeded sufficiently to produce a plurality of etch pits on the surface, and then applying an antireflective layer over the entire surface by conventional methods. It has been found that in this way, a substantially greater decrease in reflectivity is obtainable, compared to applying an antireflective coating alone.

Typically, a process of the first embodiment or the second embodiment can give rise to a surface from which about 50% less visible light is reflected, compared to a polished surface. If an antireflective coating is applied to a surface that has been textured by a process of the present invention, an even greater decrease in the amount of visible light reflected by the surface can be achieved.

When the semiconductor material is silicon and the layer of protective substance is a layer of silicon nitride about 2 nm thick, the step of etching the semiconductor may be achieved by contacting with a 1:50 (v/v) HF/nitric acid mixture as described above for a time of a few minutes, typically 2-5 minutes, at ordinary room temperatures.

In some instances it may be desirable to grow a thin (for example, 20-30 nm) layer of silicon dioxide on a silicon substrate prior to silicon nitride deposition. The growth of the oxide is not necessary for carrying out the process of the present invention (it has been observed that the process of the present invention is unaffected by the presence of a layer of silicon dioxide below the silicon nitride protective substance, except for a small increase in the time taken for the process to be completed). It has been found, however, that the presence of such an oxide layer helps to avoid degradation of the electronic properties of the silicon substrate, which is sometimes observed when no oxide is present under the layer of silicon nitride.

The process of the present invention are particularly advantageous for texturing surfaces which are not accessible to radiation, such as surfaces of silicon strips held in a frame of silicon and produced as described in International Patent Application No. WO 02/45143. Thus, in one preferred form of the invention, the semiconductor material is a strip of silicon having a thickness of less than 100 μm and a width of up to about 3 nmm and wherein at least one opposite pair of surfaces has been textured by a process according to the present invention. That is, each of at least one pair of opposite surfaces has a plurality of pits therein wherein the pits are substantially randomly distributed over the surface of the strip, and have an interior surface which is at least partially rounded, and/or have a width of up to 10 μm.

BRIEF DESCRIPTION OF THE DRAWINGS

Preferred embodiments of the present invention are hereinafter described, by way of example only, with reference to the accompanying drawings, which are briefly described as follows.

DETAILED DESCRIPTION OF THE DRAWINGS

The accompanying Figures are provided to facilitate an understanding of the invention. It will be appreciated that FIGS. 1 and 2A to 2D are not to scale and are diagrammatic only.

Figure 1:
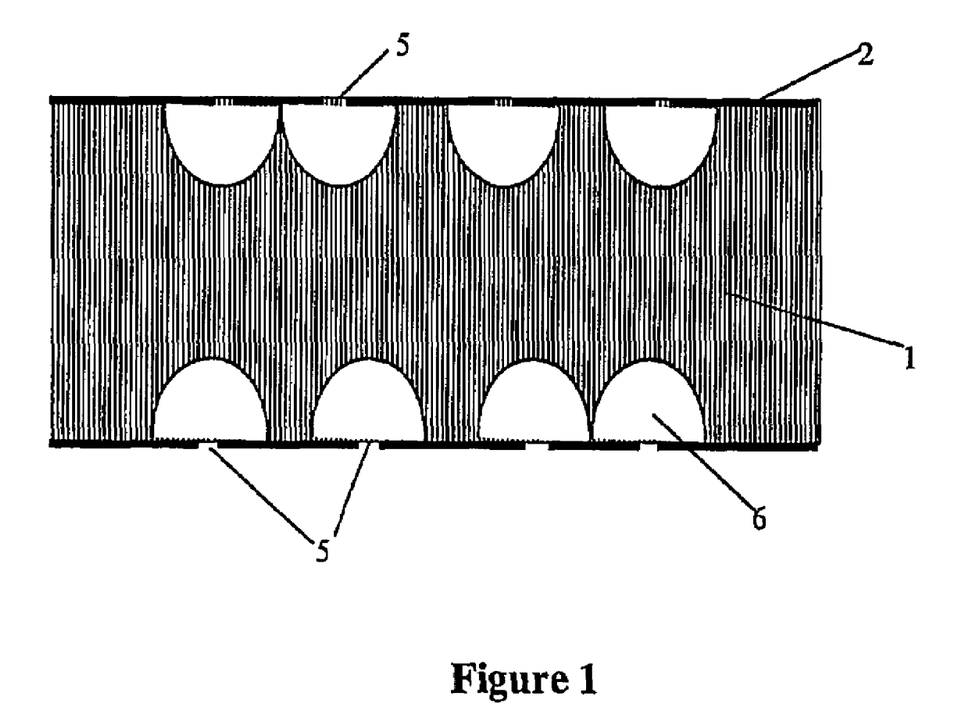
FIG. 1 is a schematic diagram of a silicon strip following surface texturing as described herein.

FIG. 1 shows a cross sectional view of a silicon strip 1 following texturing by a process in accordance with the first embodiment of the present invention. The texturing process is as follows. A thin layer of silicon nitride 2 is deposited on the silicon strip substrate 1 by low pressure chemical vapour deposition (LPCVD). This technique results in a uniform and conformal layer of silicon nitride 2 over the substrate surface. Importantly, silicon nitride 2 is also deposited by LPCVD down narrow channels or slots and onto the sidewalls of silicon strips created by the process described in International Patent Application No. WO 02/45143. Only a very thin layer of silicon nitride 2, of the order of several atomic layers thick, is deposited. Such a layer is sufficiently thin that it contains some holes 5 through which the silicon substrate is exposed. Strip 1 is then etched in a suitable etchant, such as a solution of 1:50 hydrofluoric:nitric acid. At room temperature, this solution etches silicon nitride about 3000 times slower than silicon. Consequently, etch pits 6 will form in the silicon of strip 1 at the position of holes 5. After several minutes, most of the surface will be covered in etch pits 6 up to several microns in size. Etching is now terminated. Control of the etching process can be achieved by varying the silicon nitride deposition parameters, which may influence the density of holes 5 in the layer 2, and by varying the etch time and temperature. If a lower etch temperature is used, a lower etch rate of silicon nitride 2 compared to silicon 1 can be obtained. For example, at 0° C., the etch solution etches silicon nitride 2 about 6000 times slower than silicon. It is also possible to carry out the above texturing process twice in order to obtain a further improvement in the texture properties.

Figure 2A:
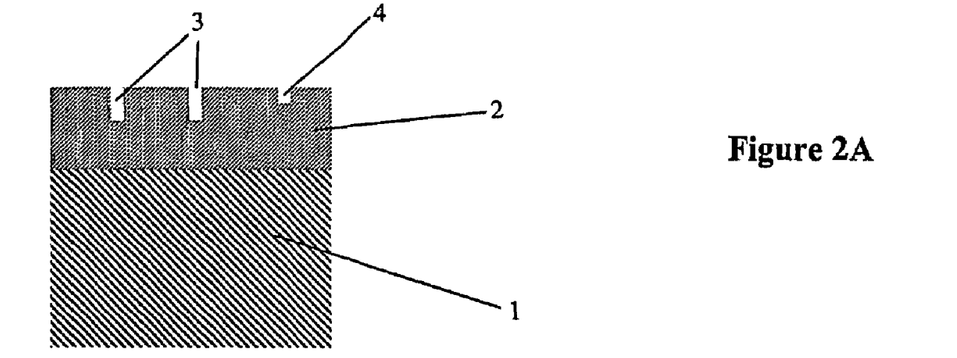
FIGS. 2A-2D are schematic diagrams illustrating a process in accordance with the present invention.

FIGS. 2A-2D show, in diagrammatic form, cross sectional views of a silicon surface at various stages of a process according to the second embodiment of the present invention. A thin layer of silicon nitride 2, of the order of 2-4 nm thick, is deposited on the surface of a silicon substrate 1 by LPCVD. FIG. 2A shows the silicon substrate 1 following nitride deposition. Nitride layer 2, as applied to the surface of silicon 1, is not a completely smooth film but contains some thickness variations. This is shown diagrammatically in FIG. 2A by depressions 3, 4. Depending on the thickness of the applied nitride layer, depressions may extend all the way to the silicon substrate surface, creating a plurality of apertures in the nitride layer, or they may extend only part of the way through the nitride layer, as shown in FIG. 2A. Also as shown in FIG. 2A, the depressions have different depths.

Figure 2B:
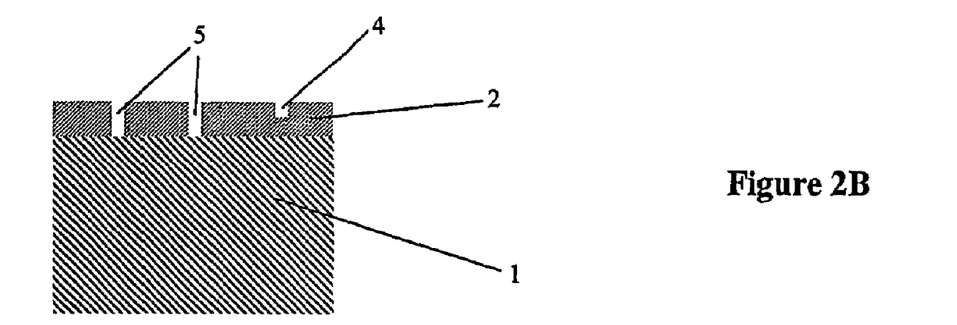

In the case where the depressions in the nitride layer do not extend all the way through the nitride layer, the silicon substrate is immersed in a solution which etches the silicon nitride. This solution could be, for example, a solution of 49% by weight aqueous hydrofluoric acid diluted with ten times its volume of water, or a mixture of hydrofluoric and nitric acid, such as a 1:50 by volume mixture of 49% by weight aqueous HF and 70% by weight nitric acid. The silicon nitride layer is gradually thinned in a uniform fashion. Eventually the nitride layer becomes sufficiently thin that the deepest depressions 3 expose the surface of silicon substrate 1, creating a plurality of apertures 5 in nitride layer 2. This is shown in FIG. 2B. Less deep depressions 4 in nitride layer 2 do not penetrate all the way through to silicon substrate 1 at this stage.

Figure 2C:
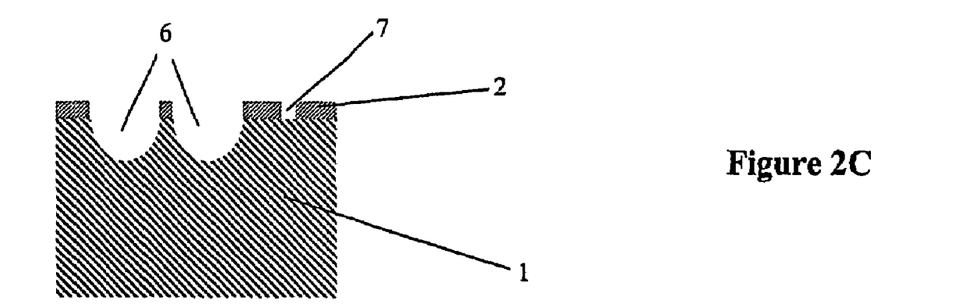

Silicon substrate 1 is now immersed in a solution which etches silicon much faster than it etches silicon nitride, such as a 1:50 by volume mixture of 49% by weight aqueous HF and 70% by weight nitric acid. This results in the formation of etch pits 6 in silicon substrate 1 at the locations where apertures 5 had been formed, as shown in FIG. 2C. The thin layer of silicon nitride 2 overhanging the etch pits 6 is very fragile and breaks off, allowing access for fresh etchant to the etch pits 6. The etch pits 6 become larger as the etching process continues.

Figure 2D:
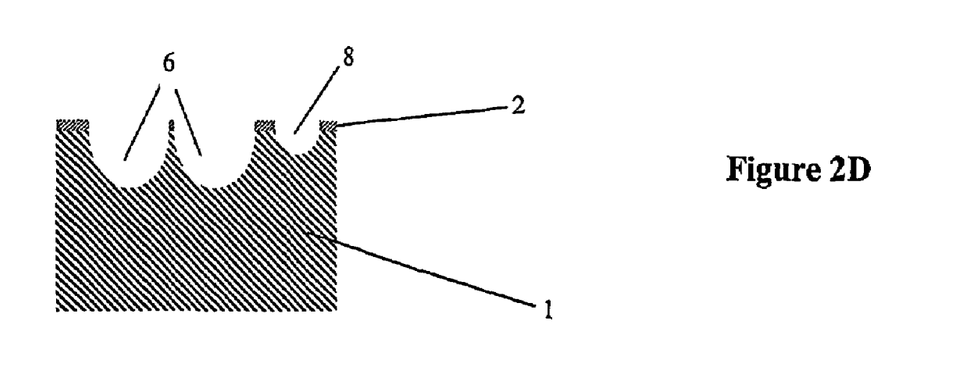

As the etching proceeds, the silicon nitride layer 2 is also thinned slightly. This may result in further apertures 7 being created in it. These apertures 7 will then also lead to the formation of etch pits 8 in the silicon substrate, as is shown in FIG. 2D. Etching is terminated when the optimal degree of texturing has been attained. This will be the case when most of the surface of the silicon 1 has been textured, but a small fraction of the surface is still untextured.

Etching can be carried out over a range of temperatures. In particular, lower temperatures generally lead to a lower etch rate of silicon nitride compared to the etch rate of silicon, so that etching at 0° C. rather than room temperature, for example, may be desirable in some circumstances. The silicon nitride layer may also be treated to decrease its etch rate in a range of silicon etchants. For example, annealing of silicon nitride at high temperatures (1000-1100° C.) generally results in a decrease in its etch rate in silicon etchants.

The above texturing technique is particularly advantageous for thin film silicon cells since it only consumes a small amount of silicon in the texturing process (approximately 2-3 microns on each textured surface). The texturing technique can be applied to silicon wafers or films of arbitrary grain size.

EXAMPLES

In all of the following examples, deposition of silicon nitride was carried out by low pressure chemical vapour deposition at 750° C. with a dichlorosilane flowrate of 30 standard cubic centimetres per minute (sccm), an ammonia flow rate of 120 sccm and a pressure of 70 Pa. Typical deposition time was 75 seconds.

Example 1

A silicon nitride layer approximately 2 nm thick was deposited on a polished silicon wafer of (111) orientation. A sample was cut out of the wafer and etched in a solution of 1:50 hydrofluoric acid:nitric acid at 0° C. The sample was encapsulated behind 1 mm thick low iron glass using silicone and its reflectance was measured using a spectrophotometer with an integrating sphere. The sample had a reflectivity of 11% at 900 nm, while a polished encapsulated silicon reference wafer had a reflectivity of 24% and a sample of (100) oriented silicon textured with inverted pyramids had a reflectivity, of 8% at the same wavelength. These results indicate that the texturing process is very effective at reducing reflection from the silicon surface.

Example 2

Etching of Thin Silicon Strips

A 100 mm diameter, 1 mm thick, (110) oriented silicon wafer was used. Thin silicon strips spaced 105 microns apart and approximately 70 microns thick were produced in the wafer, following the processes described in International Patent Application no. WO 02/45143. The sidewalls of the thin silicon strips so produced are highly polished. It was desired to texture the sidewalls as they would form the sunward facing surfaces in a solar cell.

A thin layer of silicon nitride was deposited on the wafer. One of the thin silicon strips was broken out of the wafer and mounted on the wafer surface. In this way, the sidewall surface of one of the silicon strips was clearly visible during the etching process. After a period of approximately 5 minutes etching at room temperature with the same etchant described in Example 1, the strips had textured optimally and etching was terminated. The silicon strips were now approximately 65 microns thick.

Figure 3:
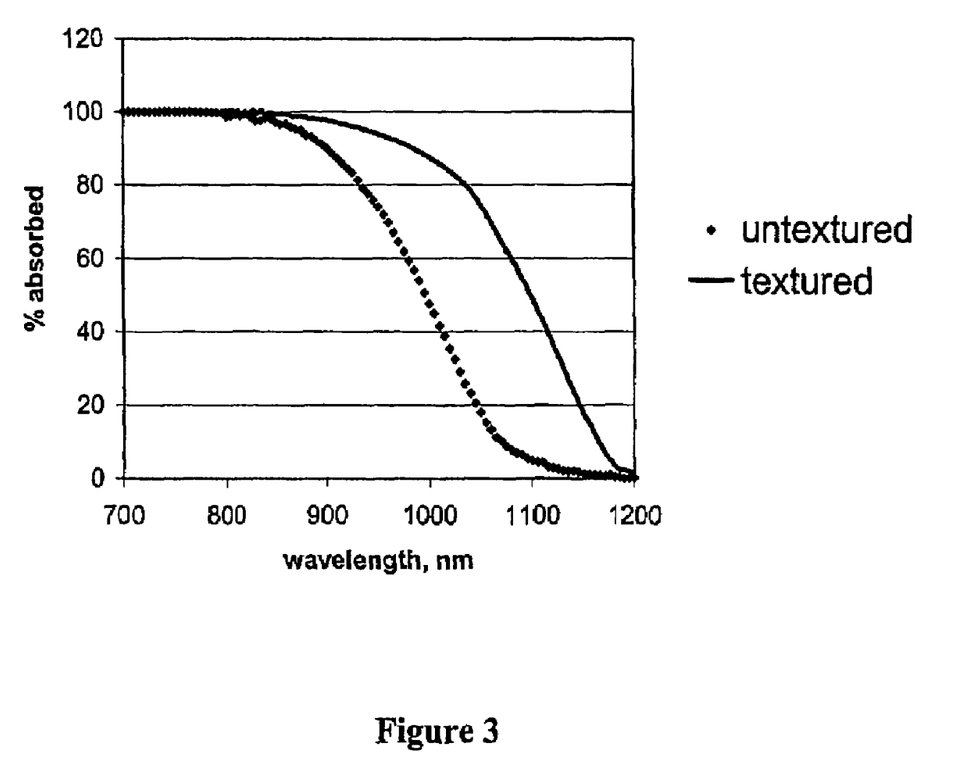
FIG. 3 is a graph showing the amount of light absorbed by strips of silicon treated by a process of the present invention (as a fraction of the amount of light entering the strip) in comparison with a silicon wafer that is polished on both sides.
Figure 4:
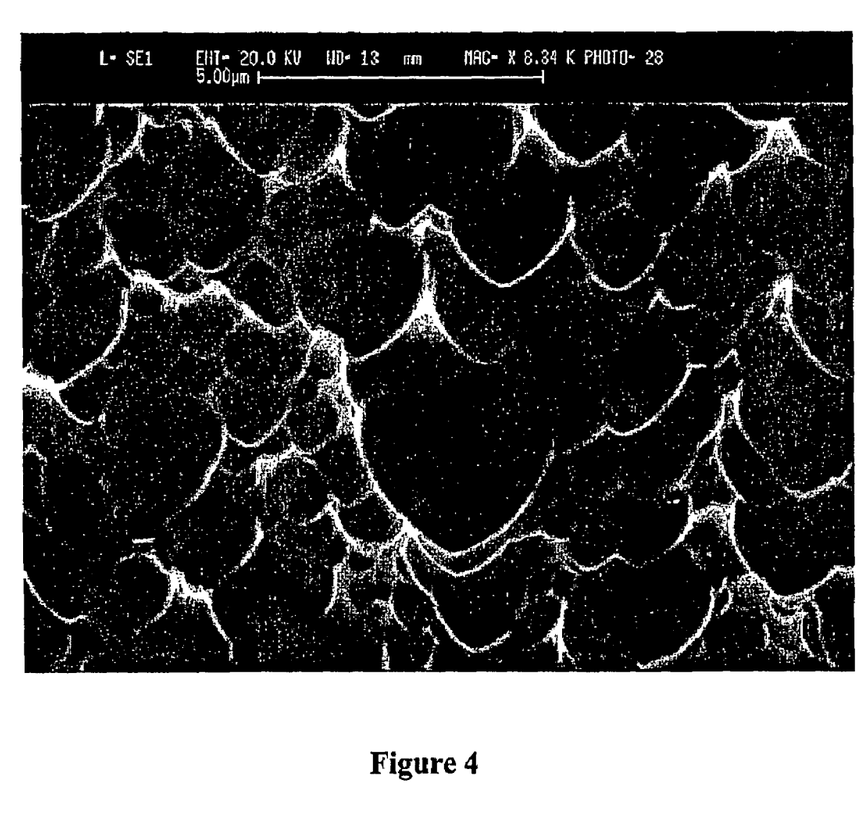
FIGS. 4 to 6 are electron micrographs of surfaces of silicon that have been textured by a process of the present invention.
Figure 5:
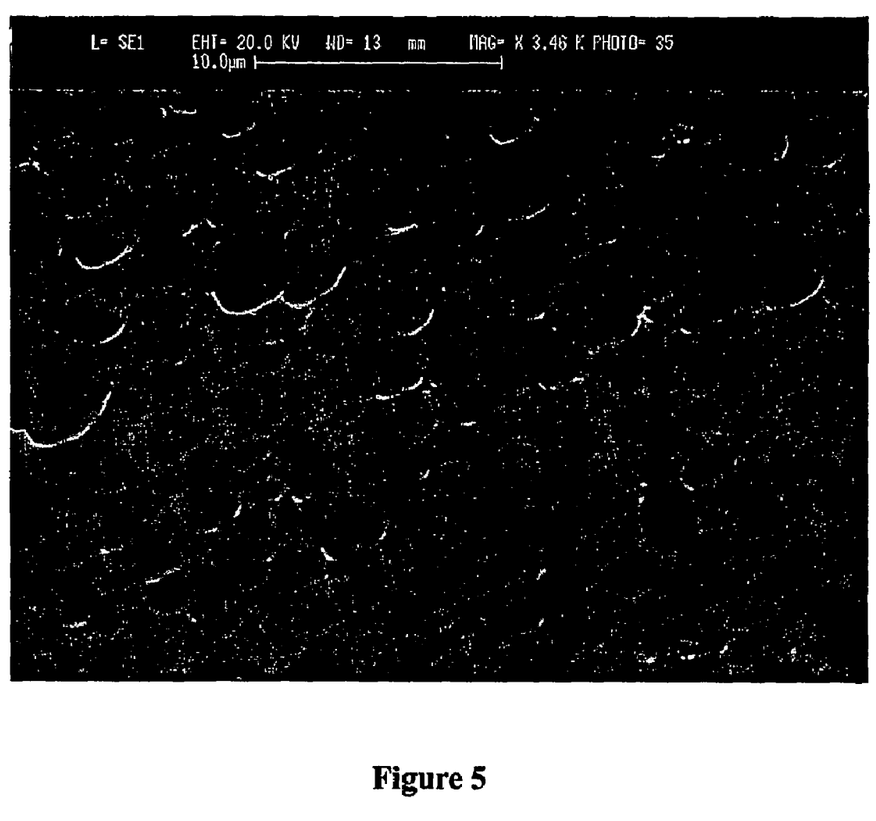
Figure 6:
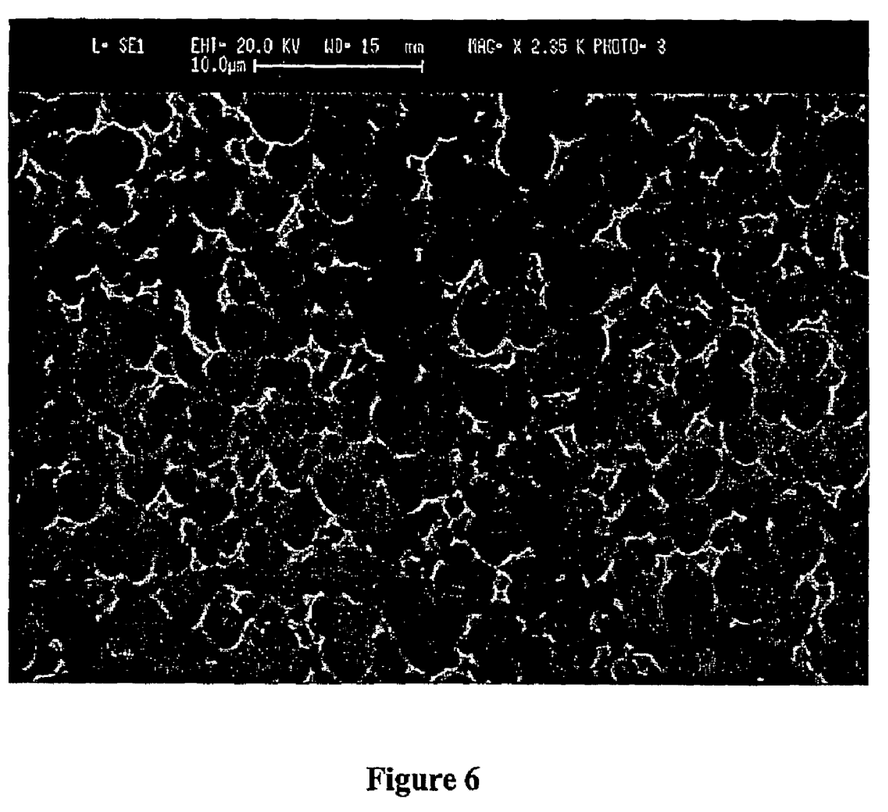

Measurements were carried out to determine the degree of light confinement (light trapping) within the textured silicon. FIG. 3 shows the amount of light absorbed (as a fraction of the amount of light entering the silicon) for the textured, 65 micron thick strips in comparison with untextured, 70 micron thick strips. It is clear that the texturing process results in significantly improved light trapping in the wavelength range 850-1100 nm, thus allowing significantly improved energy conversion efficiency if the texturing process is applied to silicon solar cells.

Example 3

Surface Passivation

Several (111) oriented, >1000 ohm-cm, boron doped float-zoned silicon wafers were used. An oxide approximately 30 nm thick was thermally grown on the wafers. A thin layer of silicon nitride was then deposited and the wafers were textured as described in Example 2. Following texturing, the wafers were given a phosphorus diffusion and a 30 nm thick oxide was thermally grown. The wafers were then given an anneal in a mixture of 5% hydrogen and 95% nitrogen at 430° C. for 30 minutes. The emitter saturation current density following these treatments was measured to be 20-25 fA/cm$^2$ per side. This low value indicates that excellent surface passivation can be achieved on the textured surfaces.

Advantages of the Processes of the Present Invention

The processes of the present invention provide relatively simple and inexpensive ways of reducing the reflectivity of a surface of a semiconductor material. Further, the processes of the present invention permit surfaces to be textured (and thereby have their reflectivity reduced) which are not exposed to radiation and which are therefore incapable of being textured by reactive ion etching, for example. Still further, the processes of the present invention are applicable to surfaces of (111) crystallographic orientation, which are not capable of being textured by etching with anisotropic etchants such as potassium hydroxide.

Many modifications of the processes described herein with reference to the accompanying drawings and Examples will be apparent to those skilled in the art without departing from the scope of the present invention.

The invention clamed is:

1. A process for texturing a surface of a semiconductor material, to result in a decreased reflectivity of said surface compared to a polished surface, the process comprising:
    applying a continuous layer of a protective substance on said surface, the protective substance comprising substantially random variations in the thickness thereof such that said layer has a plurality of randomly arranged apertures therethrough; and
    contacting said layer and said semiconductor material with an etchant capable of etching said semiconductor material faster than said protective substance, said etchant making contact with said semiconductor material at least through said apertures for a time and under conditions in which said semiconductor material is etched by said etchant in the vicinity of said apertures to produce a textured surface on said semiconductor material but said protective substance is substantially unetched, the textured surface comprising a plurality of at least partially rounded pits in said surface, wherein the density of said plurality of said pits in said surface is in the range of between 10 pits per 100 square microns to 1000 per 100 square microns.

2. A process according to claim 1, wherein said semiconductor material is silicon and said protective substance is silicon nitride.

3. A process according to claim 1, wherein said protective substance is a polymer.

4. A process according to claim 1, wherein said layer is applied to said surface by low pressure chemical vapor deposition, chemical vapor deposition, spray pyrolysis, evaporation, sputtering, thermal oxidation, thermal nitridation or spin coating.

5. A process according to claim 2, wherein said layer is applied to said surface by low pressure chemical vapor deposition.

6. A process according to claim 5, wherein said layer is about 2 nm thick.

7. A process according to claim 2, wherein a layer of silicon dioxide is present between said silicon and said silicon nitride.

8. A process according to claim 3, wherein said etchant is a plasma.

9. A process for texturing a surface of a semiconductor material to result in a decreased reflectivity of said surface compared to a polished surface, the process comprising:
    creating a continuous layer of a protective substance on said surface, the protective substance comprising substantially random variation in the thickness thereof;
    substantially uniformly thinning said layer of protective substance with an etchant until at least some randomly arranged apertures are formed through said layer; and
    contacting said layer and said semiconductor material with said etchant capable of etching said semiconductor material faster than said protective substance, said etchant making contact with said semiconductor material at least through said apertures, for a time and under conditions in which said semiconductor material is etched by said etchant in the vicinity of said apertures to produce a textured surface on said semiconductor material, but said protective substance is substantially unetched.

10. A process according to claim 9, wherein said semiconductor material is silicon and said protective substance is silicon nitride.

11. A process according to claim 9, wherein said protective substance is a polymer.

12. A process according to claim 9, wherein said layer is applied to said surface by low pressure chemical vapor deposition, chemical vapor deposition, spray pyrolysis, evaporation, sputtering, thermal oxidation, thermal nitridation or spin coating.

13. A process according to claim 10, wherein said layer is applied to said surface by low pressure chemical vapo deposition.

14. A process according to claim 10, wherein a layer of silicon dioxide is present between said silicon and said silicon nitride.

15. A process according to claim 11, wherein said etchant is a plasma.

16. A process according to claim 1, wherein prior to contacting said layer and said semiconductor material with said etchant, said layer is thinned with an etchant thereby creating said plurality of apertures therethrough.

17. A process according to claim 1, further comprising removing said protective substance from said surface after completion of said etching to expose said textured surface.

18. A process according to claim 17, wherein said protective layer is removed by applying an etchant that etches the protective substance much more rapidly than the semiconductor material.

19. A process according to claim 17, further comprising applying an antireflection coating to said textured surface.

20. A process according to claim 9, wherein the textured surface comprises a plurality of at least partially rounded pits in said surface.

21. A process according to claim 9, further comprising removing said protective substance from said surface after completion of said etching to expose said textured surface.

22. A process according to claim 21, wherein said protective layer is removed by applying an etchant that etches the protective substance much more rapidly than the semiconductor material.

23. A process according to claim 21, further comprising applying an antireflection coating to said textured surface.

24. A process according to claim 1, wherein the layer of the protective substance has random variations in thickness over the surface of the semiconductor material.

25. A process according to claim 9, wherein the layer of the protective substance has random variations in thickness over the surface of the semiconductor material.

26. A process according to claim 1, wherein the etchant is a wet etchant.

27. A process according to claim 1, wherein the etchant is a wet etchant containing hydrofluoric acid.

28. A process according to claim 1, wherein the etchant is a wet etchant containing hydrofluoric acid and nitric acid.

29. A process according to claim 9, wherein the etchant is a wet etchant.

30. A process according to claim 9, wherein the etchant is a wet etchant containing hydrofluoric acid.

31. A process according to claim 9, wherein the etchant is a wet etchant containing hydrofluoric acid and nitric acid.

32. A process according to claim 1 wherein the layer of protective substance is an incomplete layer.

33. A process according to claim 9 wherein the layer of protective substance is an incomplete layer.

34. A process according to claim 1 wherein the semiconductor material is useful for manufacture of silicon solar cells, detectors, or photodiodes, and wherein the process for texturing the surface of the semiconductor material decreases the reflectivity of the surface and increases light trapping within the textured semiconductor material.

35. A process according to claim 1 wherein the process is applied to silicon solar cells.

36. A process according to claim 1 wherein the process is adapted for texturing a plurality of surfaces which are not accessible by radiation.

37. A process according to claim 1 wherein the process is adapted for texturing a plurality of unexposed surfaces of a plurality of strips of semiconductor material held in a frame of semiconductor material.

38. A process according to claim 37 wherein the surfaces to be textured are not accessible to radiation.

39. A process according to claim 37 wherein a plurality of surfaces of each of the strips of semiconductor material are textured.

40. A process according to claim 1 wherein the semiconductor material is silicon and the surface to be textured has a (111) crystallographic orientation.

41. A process according to claim 37 further comprising the step of, prior to the step of contacting said layer with said etchant, one of said plurality of strips of semiconductor material is removed from said frame and mounted such that said surface to be textured is visible during said etching process.

42. A process according to claim 9 wherein the semiconductor material is useful for manufacture of silicon solar cells, detectors, or photodiodes, and wherein the process for texturing the surface of the semiconductor material decreases the reflectivity of the surface and increases light trapping within the textured semiconductor material.

43. A process according to claim 9 wherein the process is applied to silicon solar cells.

44. A process according to claim 9 wherein the process is adapted for texturing a plurality of surfaces which are not accessible by radiation.

45. A process according to claim 9 wherein the process is adapted for texturing a plurality of unexposed surfaces of a plurality of strips of semiconductor material held in a frame of semiconductor material.

46. A process according to claim 45 wherein the surfaces to be textured are not accessible to radiation.

47. A process according to claim 45 wherein a plurality of surfaces of each of the strips of semiconductor material are textured.

48. A process according to claim 9 wherein the semiconductor material is silicon and the surface to be textured has a (111) crystallographic orientation.

49. A process according to claim 45 further comprising the step of, prior to the step of contacting said layer with said etchant, one of said plurality of strips of semiconductor material is removed from said frame and mounted such that said surface to be textured is visible during said etching process.

50. A process according to claim 9 wherein the semiconductor material is silicon and the surface to be textured has a (111) crystallographic orientation.

51. A process according to claim 20 wherein the density of said plurality of said pits in said surface is in the range of between 10 pits per 100 square microns to 1000 per 100 square microns.

* * * * *